(12) United States Patent
Shimada

(10) Patent No.: US 9,083,505 B2
(45) Date of Patent: Jul. 14, 2015

(54) MANCHESTER CODE RECEIVING CIRCUIT

(71) Applicant: YOKOGAWA ELECTRIC CORPORATION, Tokyo (JP)

(72) Inventor: Katsuyuki Shimada, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/132,006

(22) Filed: Dec. 18, 2013

(65) Prior Publication Data

US 2014/0169507 A1    Jun. 19, 2014

(30) Foreign Application Priority Data

Dec. 19, 2012  (JP) ................................. 2012-276848
Sep. 6, 2013   (JP) ................................. 2013-185094

(51) Int. Cl.
 H03M 5/12    (2006.01)
 H04L 25/49   (2006.01)
 H04L 7/033   (2006.01)

(52) U.S. Cl.
 CPC ............... *H04L 7/0331* (2013.01); *H03M 5/12* (2013.01); *H04L 25/4904* (2013.01)

(58) Field of Classification Search
 CPC ....... H03M 5/12; H04L 7/0041; H04L 7/033; H04L 25/4904

USPC ............ 375/282, 333, 361, 359, 360; 341/70, 341/71
See application file for complete search history.

(56) References Cited

U.S. PATENT DOCUMENTS

| 5,726,650   | A  * | 3/1998 | Yeoh et al. ..................... 375/333 |
| 7,382,845   | B1 * | 6/2008 | Shenoi ........................ 375/361 |
| 2003/0154418 | A1  | 8/2003 | Vandensande |
| 2010/0008456 | A1  | 1/2010 | Rohatschek |

FOREIGN PATENT DOCUMENTS

| EP | 1335520     | A1 | 8/2003 |
| JP | 7326992     | A  | 12/1995 |
| JP | 2009-529270 | A  | 8/2009 |
| JP | 2011191226  | A  | 9/2011 |

\* cited by examiner

*Primary Examiner* — Betsy Deppe
(74) *Attorney, Agent, or Firm* — Sughrue Mion, PLLC

(57) ABSTRACT

A Manchester code receiving circuit includes an analog circuit configured to convert an analog signal received through a communication transmission path, to a digital signal based on a Manchester code, and a characteristic compensating unit configured to compensate at least one of rise delay characteristics in which a rising time of the digital signal is longer than a falling time, and fall delay characteristics in which the falling time of the digital signal is longer than the rising time.

1 Claim, 18 Drawing Sheets

FIG. 2

| VALUE OF LOWER (N − 1) BITS OF CLOCK EXTRACTION COUNTER 232 | NEXT COUNT VALUE OF CLOCK EXTRACTION COUNTER 232 |
|---|---|
| 0 | (CURRENT COUNT VALUE + 1) |
| 1 | (CURRENT COUNT VALUE + 1) − 1 |
| 2 | (CURRENT COUNT VALUE + 1) − 2 |
| 3 | (CURRENT COUNT VALUE + 1) − 3 |
| ⋮ | ⋮ |
| $2^{N-2} - 2$ | (CURRENT COUNT VALUE + 1) − $(2^{N-2} - 2)$ |
| $2^{N-2} - 1$ | (CURRENT COUNT VALUE + 1) − $(2^{N-2} - 1)$ |
| $2^{N-2}$ | (CURRENT COUNT VALUE + 1) − $2^{N-2}$ |
| $2^{N-2} + 1$ | (CURRENT COUNT VALUE + 1) + $(2^{N-2} - 1)$ |
| $2^{N-2} + 2$ | (CURRENT COUNT VALUE + 1) + $(2^{N-2} - 2)$ |
| ⋮ | ⋮ |
| $2^{N-2} - 3$ | (CURRENT COUNT VALUE + 1) + 3 |
| $2^{N-2} - 2$ | (CURRENT COUNT VALUE + 1) + 2 |
| $2^{N-2} - 1$ | (CURRENT COUNT VALUE + 1) + 1 |

FIG. 3

| VALUE OF LOWER 3 BITS OF CLOCK EXTRACTION COUNTER 232 | COUNT VALUE OF CLOCK EXTRACTION COUNTER 232 |
|---|---|
| 0 | CURRENT COUNT VALUE + 1 |
| 1 | CURRENT COUNT VALUE |
| 2 | CURRENT COUNT VALUE − 1 |
| 3 | CURRENT COUNT VALUE − 2 |
| 4 | CURRENT COUNT VALUE + 5 |
| 5 | CURRENT COUNT VALUE + 4 |
| 6 | CURRENT COUNT VALUE + 3 |
| 7 | CURRENT COUNT VALUE + 2 |

FIG. 14A

| 2-BIT DATA SAMPLED BY RECEPTION CLOCK | | TYPE OF SIGNAL |
|---|---|---|
| 0 | 0 | "N−" |
| 0 | 1 | "0" |
| 1 | 0 | "1" |
| 1 | 1 | "N+" |

FIG. 14B

<N-BIT COUNTER>

| VALUE OF LOWER (N − 1) BITS OF CLOCK EXTRACTION COUNTER 232 AT TIMING WHEN EDGE DETECTION SIGNAL IS GENERATED | NEXT COUNTER VALUE OF CLOCK EXTRACTION COUNTER 232 |
|---|---|
| $1 \sim 2^{N-2}$ | (CURRENT COUNT VALUE + 1) − 1 |
| $2^{N-2} + 1 \sim 2^{N-2} - 1$ | (CURRENT COUNT VALUE + 1) + 1 |
| OTHERS | CURRENT COUNT VALUE + 1 |

FIG. 14C

<4-BIT COUNTER>

| VALUE OF LOWER 3 BITS OF CLOCK EXTRACTION COUNTER 232 AT TIMING | WHEN EDGE DETECTION SIGNAL IS GENERATED |
|---|---|
| 1∼4 | CURRENT COUNT VALUE |
| 5∼7 | CURRENT COUNT VALUE + 2 |
| OTHERS | CURRENT COUNT VALUE + 1 |

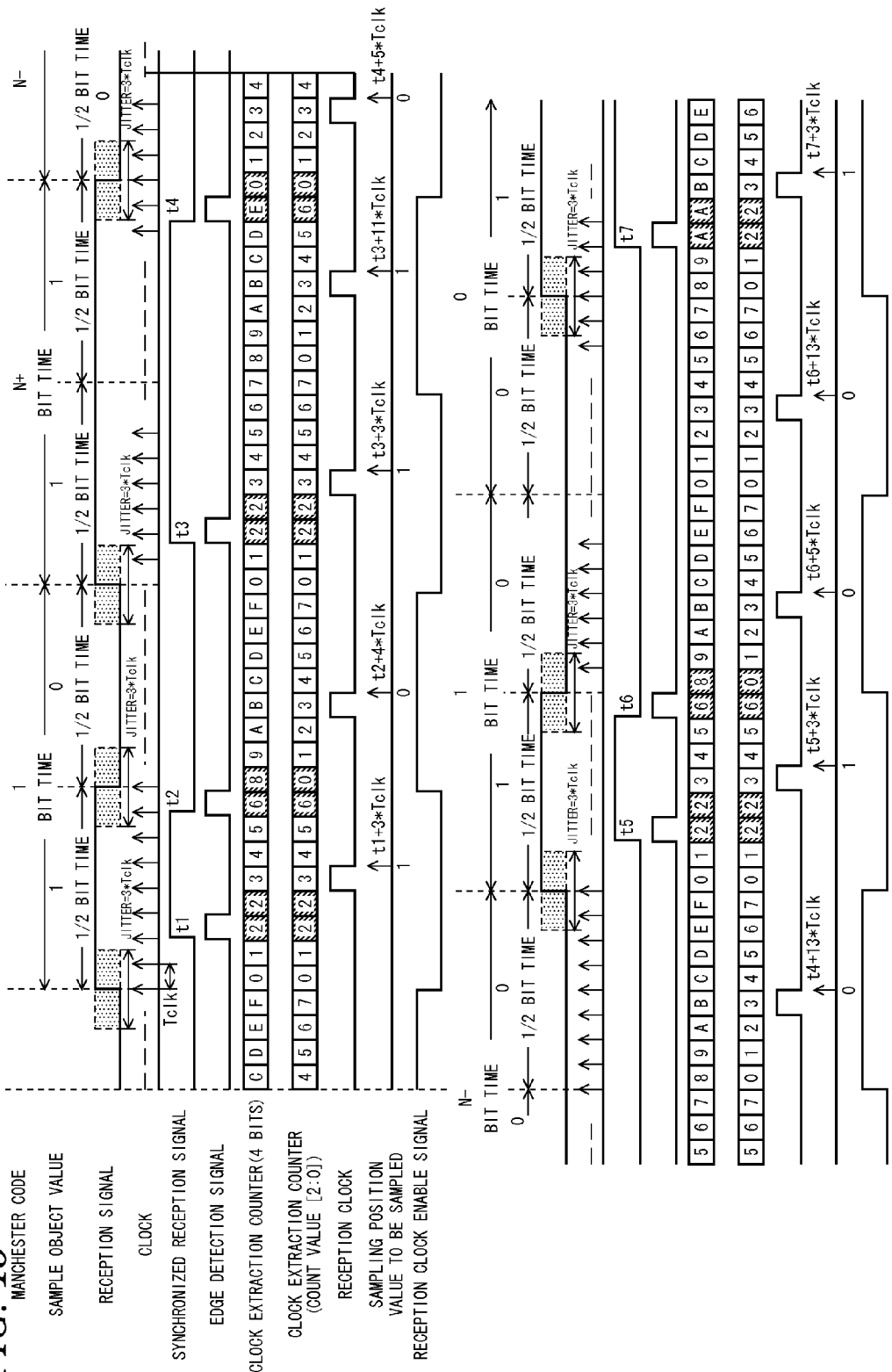

FIG. 18

MANCHESTER CODE RECEIVING CIRCUIT

CROSS-REFERENCE TO RELATED APPLICATION(S)

The present application claims the benefit of priorities of Japanese Patent Application No. 2012-276848, filed on Dec. 19, 2012 and Japanese Patent Application No. 2013-185094, filed on Sep. 6, 2013. The disclosures of the applications are incorporated herein by reference.

BACKGROUND

1. Technical Field

The present disclosure relates to a Manchester code receiving circuit, and more particularly to a technique for improving the jitter tolerance of a reception signal.

2. Related Art

A Manchester code is used in communication according to, for example, Fieldbus which is a standard for performing digital communication between measuring/controlling apparatuses. In a Manchester code, the signal level changes in the middle of a signal indicative of each 0/1 bit. Therefore, a reception clock signal which functions as the reference of the transmission can be transmitted while being superimposed on a data signal.

FIG. 7 is a block diagram showing a configuration example of a related-art data receiving circuit for receiving data which are encoded in a Manchester code. Referring to FIG. 7, a data receiving circuit 200 which receives data from a communication transmission path 100 includes a MAU (Medium Attachment Unit) 210, an edge detecting module 220, a reception clock extracting module 230, a code detecting module 240, and a reception controlling module 250. The transmission path 100 may be configured by wired means such as a coaxial cable, or by wireless means.

The MAU 210 converts an analog signal transmitted through the transmission medium of the communication transmission path 100, to a digitized reception signal. The edge detecting module 220 synchronizes the digitized reception signal to a clock signal inside the data receiving circuit 200, to produce a synchronized reception signal, detects rising and falling edges from the synchronized reception signal, and outputs an edge detection signal. The rate of the clock signal is $2^N$ (N is an integer of three or more) times a predetermined communication rate.

FIG. 8 is a waveform chart showing a manner in which the edge detection signal is output from falling and rising edges of a synchronized reception signal of a Manchester code. The synchronized reception signal of a Manchester code changes at the middle of a bit time corresponding to the transfer time of one bit. When the change is detected, the edge detection signal having the clock width is output. In the case where the same bit signals are continuously output, for example, the edge detection signal is output also at the start of the latter bit time. Therefore, the edge detection signal indicates one of the boundaries and middle of a bit time.

Returning to the description of FIG. 7, the reception clock extracting module 230 produces a reception clock signal and a reception clock enable signal based on the clock signal and the edge detection signal. The reception clock signal is a clock signal for allowing the code detecting module 240 to sample a bit signal in which the signal level changes at the middle. Since one bit signal must be sampled two times, the rate of the reception clock signal is two times the communication rate per one bit.

The reception clock enable signal enables the reception clock signal every other time so that the reception controlling module 250 which is in the subsequent stage, and which receives the produced reception clock signal operates at a clock frequency corresponding to the communication rate that is one half of the rate of the reception clock signal.

The code detecting module 240 samples and decodes the synchronized reception signal at the rising timing of the reception clock signal to output a code type signal and received data. The code type signal indicates the preamble, the start delimiter, the end delimiter, the data code, etc. FIG. 9 shows the code definitions of the preamble, the start delimiter, and the end delimiter in a Manchester code, and an example of the data code ("11001010").

Returning again to FIG. 7, the reception controlling module 250 controls the reception of the received data based on the received data and code type signal which are input to the module. This control operation is performed on the basis of the bit time. Therefore, the reception controlling module 250 uses the reception clock signal while the reception clock signal is enabled every other time by the reception clock enable signal.

The reception clock extracting module 230 includes a clock extraction counter 232 for producing the reception clock signal and the reception clock enable signal based on the clock signal and the edge detection signal. The clock extraction counter 232 counts the clock signal, and, when the rate of the clock signal is $2^N$ times the predetermined communication rate, performs a wrap around operation of an N-bit width. When an overflow occurs, namely, the count value returns to 0. In the following description, the count value is indicated in hexadecimal notation. When N=4, for example, the count value changes in a sequence of 0, 1, 2, . . . , E, F, 0, 1, . . . in each clock cycle.

In the case of N=4, when the communication rate is the predetermined one, the bit time corresponds to $2^4$=16 clock cycles. As shown in FIG. 10, therefore, the reception clock signal is inverted every 4 clock cycles, and the reception clock enable signal is inverted every 8 clock cycles. Namely, the reception clock signal is inverted when the count value of the clock extraction counter 232 changes to 4, 8, C, and 0, and the reception clock enable signal is inverted when the count value changes to 8 and 0.

When the bit width of the clock extraction counter 232 is N, the reception clock signal is inverted when the second significant bit of the clock extraction counter 232 changes, and the reception clock enable signal is inverted when the most significant bit changes.

In actual communication, however, bit time distortion occurs, and the bit time is lengthened or shortened with respect to $2^N$ clock cycles of the clock signal. In this case, as shown in FIG. 11, the sampling interval which is set in accordance with the reception clock signal, and the bit time of the synchronized reception signal are misaligned with each other, and therefore the sampling of the synchronized reception signal sometimes fails. FIG. 11 shows an example where the bit time is longer than $2^N$ clock cycles. In the broken line circle in the figure, the same signal is sampled two times.

In order to prevent such a situation from occurring, the reception clock extracting module 230 includes a clock extraction controlling module 231 which controls the count value based on the edge detection signal. In accordance with the count value of the clock extraction counter 232 at the timing when the edge detection signal is detected, the clock extraction controlling module 231 adjusts the next count value. Specifically, the count value is adjusted in the following manner. When the detected edge position leads an ideal edge position where there is no jitter (when the detection is done at an early timing), the count up operation is further advanced (+2) from the normal value (+1) by 1, and, when the detected edge position lags (when the detection is done at a late timing), the operation is further delayed (±0) from the normal value (+1) by 1.

When the value of the lower (N−1) bits of the clock extraction counter 232 at the timing when the edge detection signal is detected is from 1 to $2^{N-2}$, namely, the next count value is not increased and remains at the current count value, and, when the value of the lower (N−1) bits is from $2^{N-2}+1$ to $2^{N-1}-1$, the next count value is increased by 2 which is larger by 1 than normal one. In the former case, the same value is counted two times, and, in the latter case, the counting is skipped by 1. In the other case, the adjustment is not necessary, and therefore the count value is increased by an increment of 1 as usual.

In the case where the bit width of the clock extraction counter 232 is 4, when the communication rate is the predetermined one, the edge detection signal is detected at the timing when the count value is 0 or 8. In the case where the edge detection signal is detected at the timing when the count value is 0 or 8, therefore, the adjustment is not performed, and the count value is increased by 1 as usual.

In the case where the bit time is longer than the predetermined one, and the edge detection signal is detected at the timing when the count value is from 1 to 4 or from 9 to C, by contrast, the count value is not increased and remains at the current count value, and, in the case where the bit time is shorter than the predetermined one, and the edge detection signal is detected at the timing when the count value is from 5 to 7 or from D to F, the count value is increased by 2.

FIG. 12 is a timing chart illustrating an example of the operation of the circuit of FIG. 7. In the example, it is assumed that the bit time is longer than the predetermined one, and the edge detection signal is detected at timing T1 when the count value is 9. In this case, the next count value is not increased to A and remains at the current count value of 9 as indicated by the white numeral. Therefore, subsequent sampling timings can be delayed by one clock cycle of the clock signal. The reception clock extracting module 230 performs the above-described adjustment at respective timings T2, T3, T4, T5, and T6 to cause the count value to follow the distortion of the bit timing.

Patent Document 1 discloses a technique of a communication apparatus in a field bus system in which the consumption current of a field apparatus can be reduced, and which uses a Manchester code.

Patent Document 2 discloses a technique of a clock extracting circuit which can obtain correct position data with a constant period from a serial encoder.

PRIOR ART LITERATURE

Patent Documents

[Patent Document 1] JP-A-H07-326992
[Patent Document 2] JP-A-2011-191226

As indicated by the shading in FIG. 13, usually, a digital signal such as a Manchester code often contains a jitter component at each edge. When a reception signal contains a jitter component, the position of an edge is deviated from an ideal position where there is no jitter.

FIG. 13 is a diagram illustrating the definition of jitter, and shows an example of a reception signal of a Manchester code. Referring to FIG. 13, jitter means a width Tjit in the case where the positions of edges are deviated with respect to an ideal waveform where there is no jitter, by ½*Tjit at the maximum in the + direction or by ½*Tjit at the maximum in the − direction. For example, the jitter Tjit of 6 μs means that the position of each edge is deviated by 3 μs at the maximum with respect to an ideal edge position in arbitrary one of the ± directions. In this case, it is assumed that distortion relating to the bit time (a phenomenon in which the actual bit time is longer or shorter than a predetermined bit time) is not generated.

A Manchester code is correctly sampled by a method in which a signal of 1 bit time of communication data is sampled once per ½ bit time, and twice in total. In a Manchester code, namely, sampling must be performed twice at 1 bit time of communication data. Therefore, sampling is performed by a reception clock signal the rate of which is two times the communication rate.

As shown in FIG. 14A, the relationships between 2-bit data which are twice sampled, and the types of signals indicated by the data are 00→"N−", 01→"0", 10→"1", and 11→"N+".

In the case of an N-bit counter, the relationships between the value of the lower (N−1) bits of the clock extraction counter 232 at the timing when the edge detection signal is generated, and the adjustment of the next count value of the clock extraction counter 232 are as shown in FIG. 14B. In the case of a 4-bit counter, the relationships are as shown in FIG. 14C.

FIG. 15 is a timing chart illustrating another example of the operation of the circuit of FIG. 7, and shows the case where, when the bit width of the clock extraction counter 232 is N=4, and the length of one clock cycle is Tclk, the jitter Tjit indicated by Tjit=3*Tclk is generated.

Referring to FIG. 15, the edge position of the reception signal is deviated by ±½*Tjit=±½*(3*Tclk) with respect to an ideal edge position. When the count value of the clock extraction counter 232 is adequately adjusted, however, the synchronized reception signal can be correctly sampled.

When the bit width of the clock extraction counter 232 is N, the reception jitter tolerance (limitation of jitter) with respect to the reception signal supplied to the data receiving circuit 200 is $(2^{N-2}-1)*Tclk$. In order to correctly acquire the synchronized reception signal, sampling must be performed once at ½ bit time and twice at 1 bit time because, when jitter is within $(2^{N-2}-1)*Tclk$, this is satisfied by always holding the following conditions. When jitter exceeds $(2^{N-2}-1)*Tclk$, however, one of the following conditions is not satisfied, and sampling which is to be performed once at ½ bit time and twice at 1 bit time is disabled.

(1) Both the maximum values of the High and Low pulse widths of the synchronized reception signal are 1 bit time $(=2^N*Tclk)+(2^{N-2}-1)*Tclk$ (when 1 bit time=32 μs, N=4, and Tclk=2 μs, for example, 38 μs).

(2) Both the minimum values of the High and Low pulse widths of the synchronized reception signal are ½ bit time $(=2^{N-1}*Tclk)-(2^{N-2}-1)*Tclk$ (when 1 bit time=32 μs, N=4, and Tclk=2 μs, for example, 10 μs).

(3) In the case where the High or Low pulse width of ideal 1 bit time of the synchronized reception signal is shortened by jitter, both the minimum values of the High and Low pulse widths are 1 bit time $(=2^N*Tclk)-(2^{N-2}-1)*Tclk$ (when 1 bit time=32 μs, N=4, and Tclk=2 μs, for example, 26 μs).

(4) In the case where the High or Low pulse width of ideal ½ bit time of the synchronized reception signal is lengthened by jitter, both the maximum values of the High and Low pulse widths are ½ bit time (=$2^{N-1}$*Tclk)+($2^{N-2}$−1)*Tclk
(when 1 bit time=32 μs, N=4, and Tclk=2 μs, for example, 22 μs).

FIG. 16 is a timing chart illustrating a further example of the operation of the circuit of FIG. 7, and shows the case where, as a result of a situation where jitter exceeds a predetermined value, sampling which is to be performed once at ½ bit time and twice at 1 bit time is disabled. The example shows the case where jitter is 4*Tclk, and the bit width of the clock extraction counter 232 is N=4.

Referring to FIG. 16, at the timing when the edge detection signal indicative of detection of edge t2 of the synchronized reception signal is generated, the value of the lower 3 bits of the clock extraction counter 232 is 0. While using this as the starting point, thereafter, the counter value of the clock extraction counter 232 is adjusted. Since the pulse of the synchronized reception signal between edges t2 and t3 is originally a pulse of ½ bit time, the correct sampling number is 1. However, the pulse width exceeds the conditions of (4) above to become 12*Tclk. In addition to the first sampling of t2+4*Tclk, therefore, the second sampling of t2+12*Tclk occurs, so that a Manchester code cannot be correctly received as shown in the cross-hatched portions (edges t3, t5, t6, and t7 of the synchronized reception signal) of the value to be sampled.

Since the pulse of the synchronized reception signal between edges t4 and t5 is originally a pulse of 1 bit time, the correct sampling number is 2. However, the pulse width exceeds the conditions of (1) above to become 20*Tclk. In addition to the first sampling of t2+4*Tclk and the second sampling of t2+12*Tclk, therefore, the third sampling of t4+20*Tclk occurs. Also in this case, a Manchester code cannot be correctly received as shown in the cross-hatched portions of the value to be sampled.

When it is assumed that an analog circuit which is disposed in the MAU 210 in FIG. 7, and which outputs a Manchester code has characteristics of a) or b) below, jitter of a digital circuit exceeds ($2^{N-2}$−1)*Tclk, or namely the pulse width of the synchronized reception signal is varied, and one of the conditions of (1) to (4) above is not satisfied, so that the digital circuit cannot correctly receive the Manchester code. As a result, the total jitter tolerance of the analog circuit and the digital circuit falls below ($2^{N-2}$−1)*Tclk, and the performance of the whole circuit is lowered.

a) The reception signal which is output from the analog circuit has rise delay characteristics in which the rising time is longer than the falling time. Because of the characteristics, the High pulse width is short, and the Low pulse width is long.

b) The reception signal which is output from the analog circuit has fall delay characteristics in which the falling time is longer than the rising time. Because of the characteristics, the Low pulse width is short, and the High pulse width is long.

FIGS. 17A and 17B are diagrams showing waveform examples of a Manchester code, FIG. 17A shows jitter in the case where rising is delayed because of the characteristics of a) above of the analog circuit, and FIG. 17B shows jitter in the case where falling is delayed because of the characteristics of b) above of the analog circuit.

Referring to FIG. 17A, when it is assumed that the rising time is delayed by Td, the position of the rising edge is deviated by +(½*Tjit+Td) at the maximum with respect to an ideal waveform where there is no jitter. In the above, Td indicates the time difference between the rising and the falling. In an example where jitter is 6 μS and Td=1 μS, the position of the rising edge is deviated by +4 (=3+1) μS at the maximum.

Referring to FIG. 17B, when it is assumed that the falling time is delayed by Td, the position of the falling edge is deviated by +(½*Tjit+Td) at the maximum with respect to an ideal waveform where there is no jitter. In an example where jitter is 6 μS and Td=1 μS, the position of the falling edge is deviated by +4 (=3+1) μS at the maximum.

Figure 18:
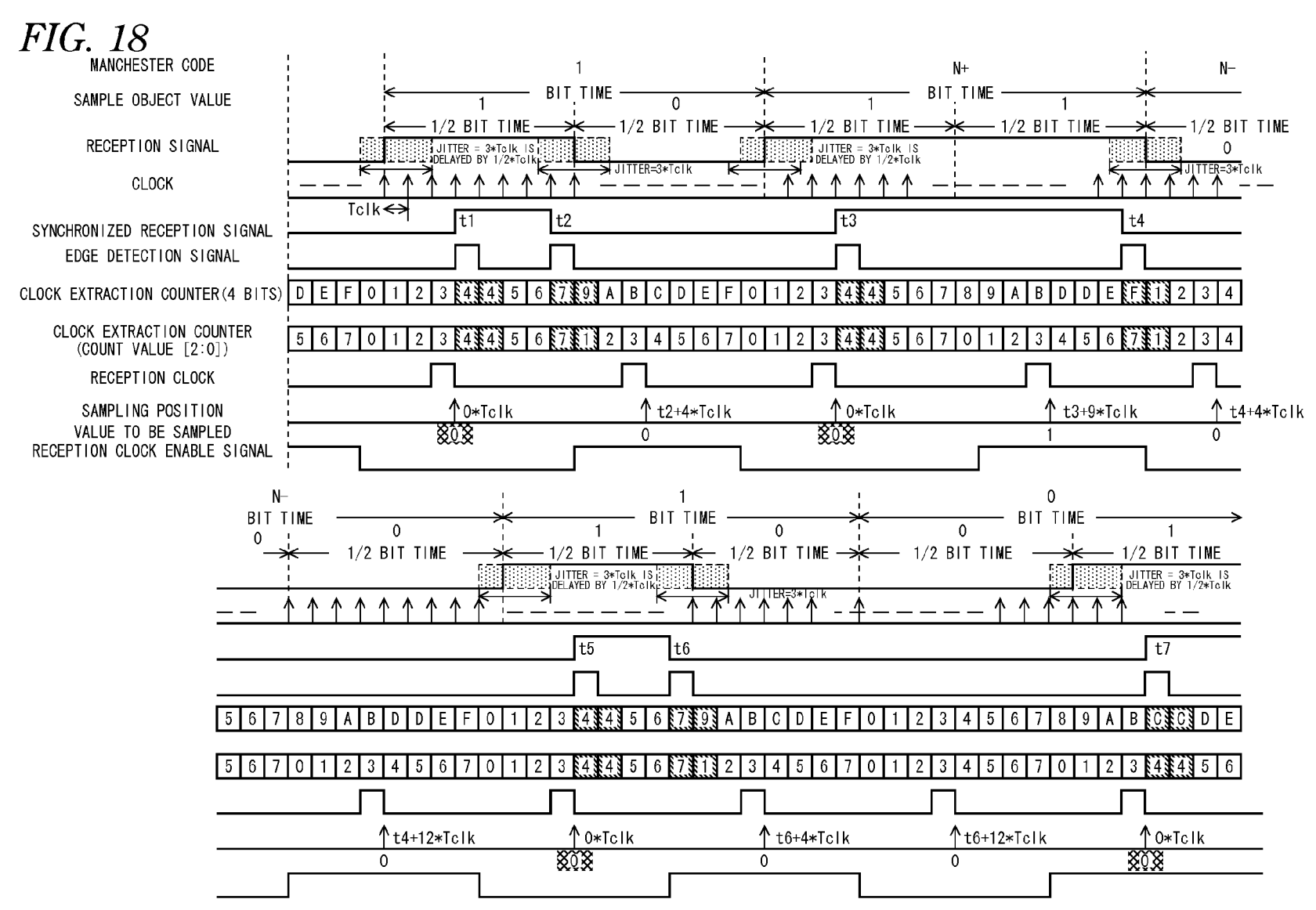

FIG. 18 is a timing chart illustrating a still further example of the operation of the circuit of FIG. 7. In FIG. 18, the bit width of the clock extraction counter 232 is N=4, and the analog circuit has the characteristics of a) above. In this case, positional deviation of an edge of which exceeds ½*(3*Tclk) occurs in a digital circuit. As a result, jitter exceeds 3*Tclk, and a Manchester code cannot be correctly received as shown in the cross-hatched portions (edges t1, t3, t5, and t7 of the synchronized reception signal) of the value to be sampled.

SUMMARY

Exemplary embodiments of the invention provide a Manchester code receiving circuit in which the reception jitter tolerance can be prevented from being impaired by characteristics of an analog circuit, and can be enhanced by the whole analog and digital circuits.

A Manchester code receiving circuit according to an exemplary embodiment of the invention, comprises:

an analog circuit configured to convert an analog signal received through a communication transmission path, to a digital signal based on a Manchester code; and a characteristic compensating unit configured to compensate at least one of rise delay characteristics in which a rising time of the digital signal is longer than a falling time, and fall delay characteristics in which the falling time of the digital signal is longer than the rising time.

The characteristic compensating unit may be configured to perform compensation while further considering characteristics of a digital circuit which is connected to a stage subsequent to the analog circuit.

The characteristic compensating unit may include a characteristic-based control element storing module configured to store a characteristic-based control element, and is configured to execute a clock extracting operation based on the characteristic-based control element which is read out from the characteristic-based control element storing module.

According to the configuration, a jitter increase in a Manchester code which is caused by a difference between the rising time and the falling time can be compensated, and the reception jitter tolerance can be enhanced.

BRIEF DESCRIPTION OF THE DRAWINGS

FIG. 2 is an adjusting table of count values in case of N bit counter.

FIG. 3 is an adjusting table of count values in case of 4 bit counter.

FIGS. 14A to 14C are diagrams explaining sampled data and types of signals of Manchester code in FIG. 7 and adjustment of count values.

FIG. 15 is a timing chart illustrating another example of the operation in FIG. 7.

FIG. 18 is a timing chart illustrating a still further example of the operation in FIG. 7.

DETAILED DESCRIPTION

Figure 1:
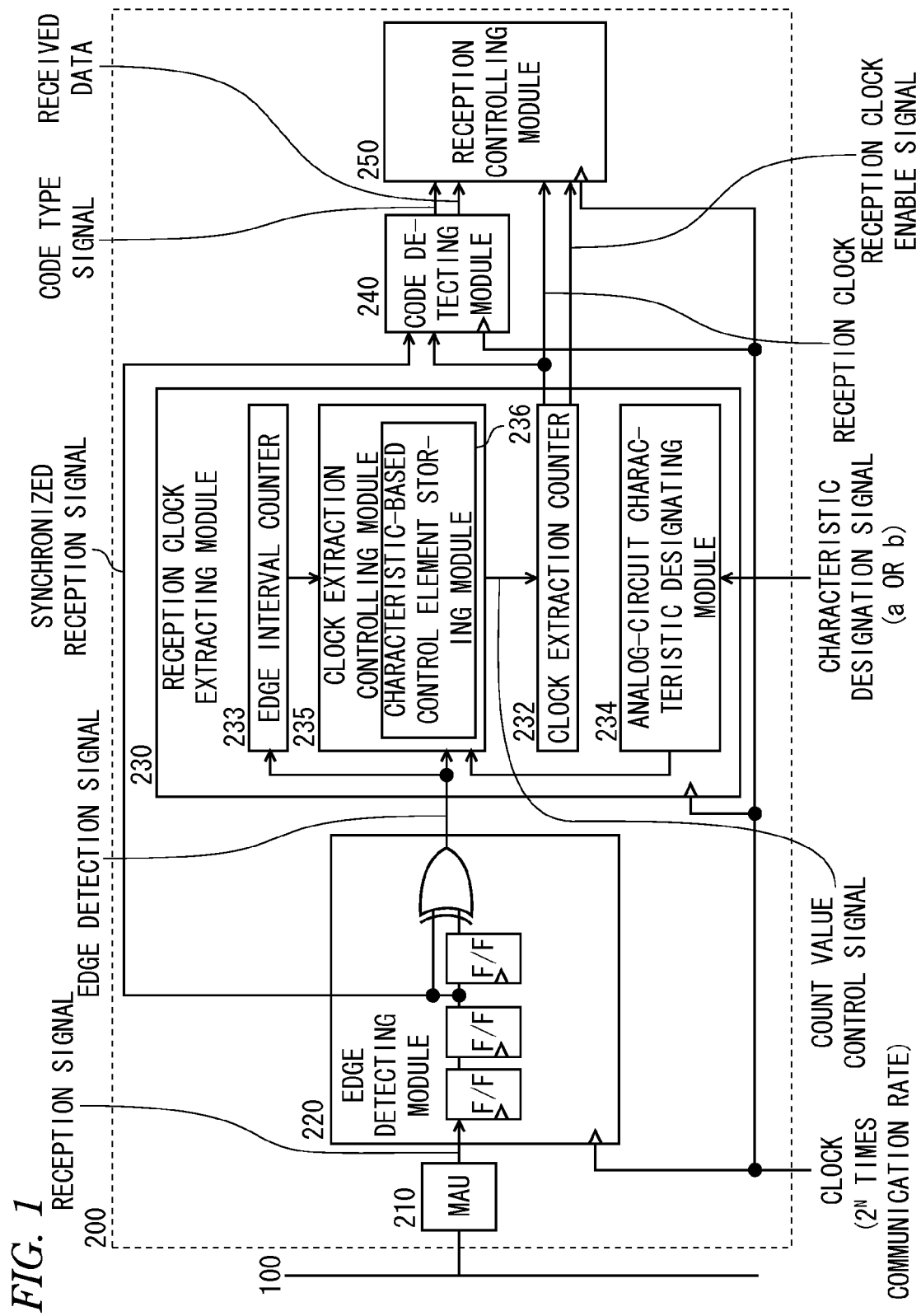
FIG. 1 is a block diagram showing an embodiment of the invention.
Figure 7:
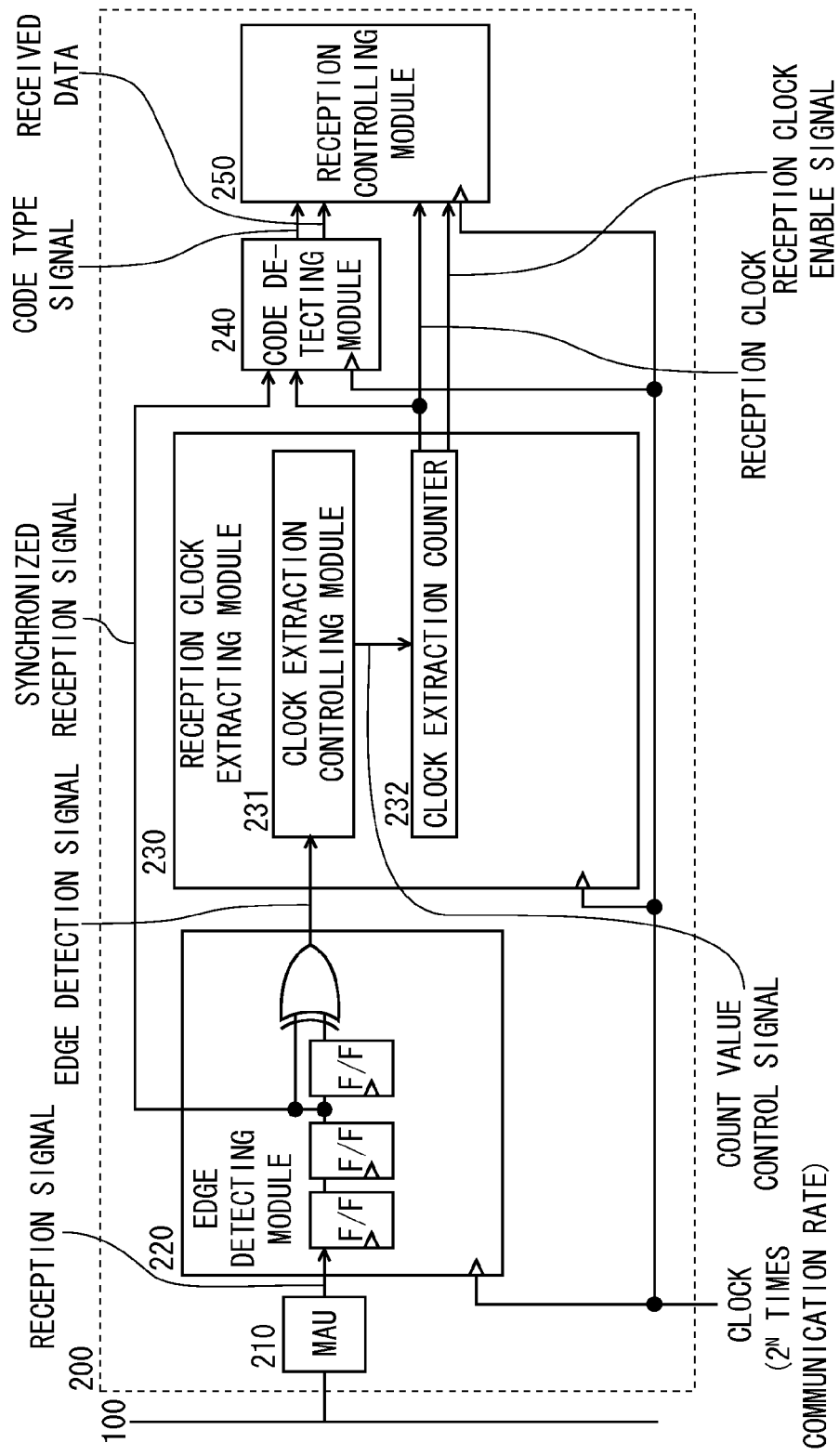
FIG. 7 is a block diagram showing a configuration example of a related-art Manchester code data receiving circuit.
Figure 8:
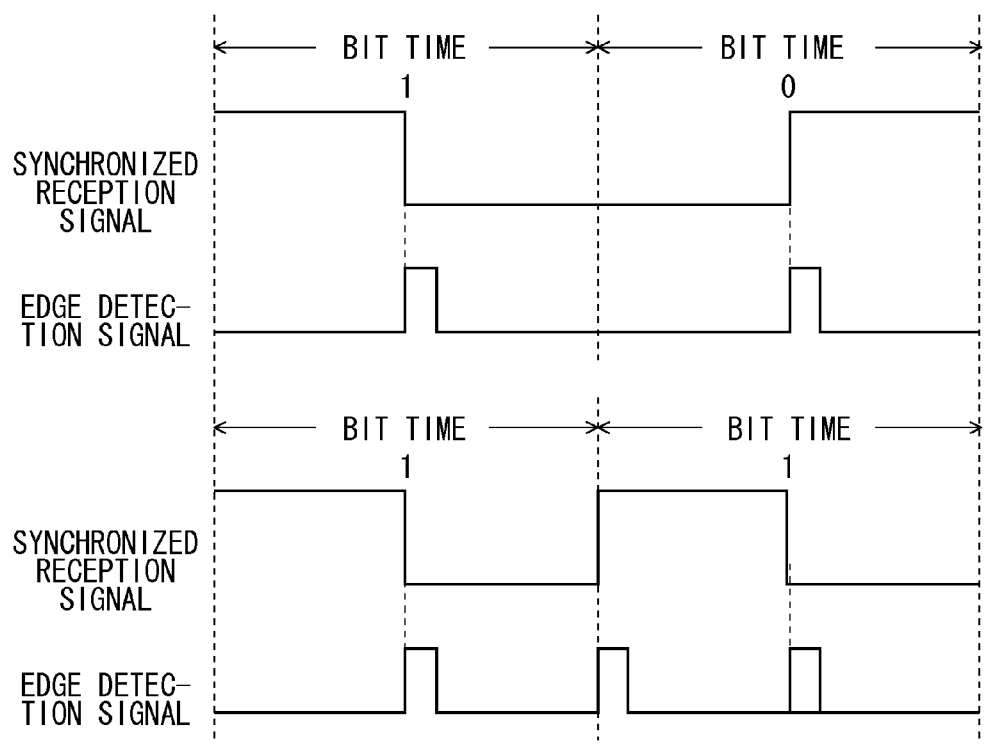
FIG. 8 is a waveform chart showing a manner in which the edge detection signal is output from falling and rising edges of a synchronized reception signal of a Manchester code.
Figure 9:
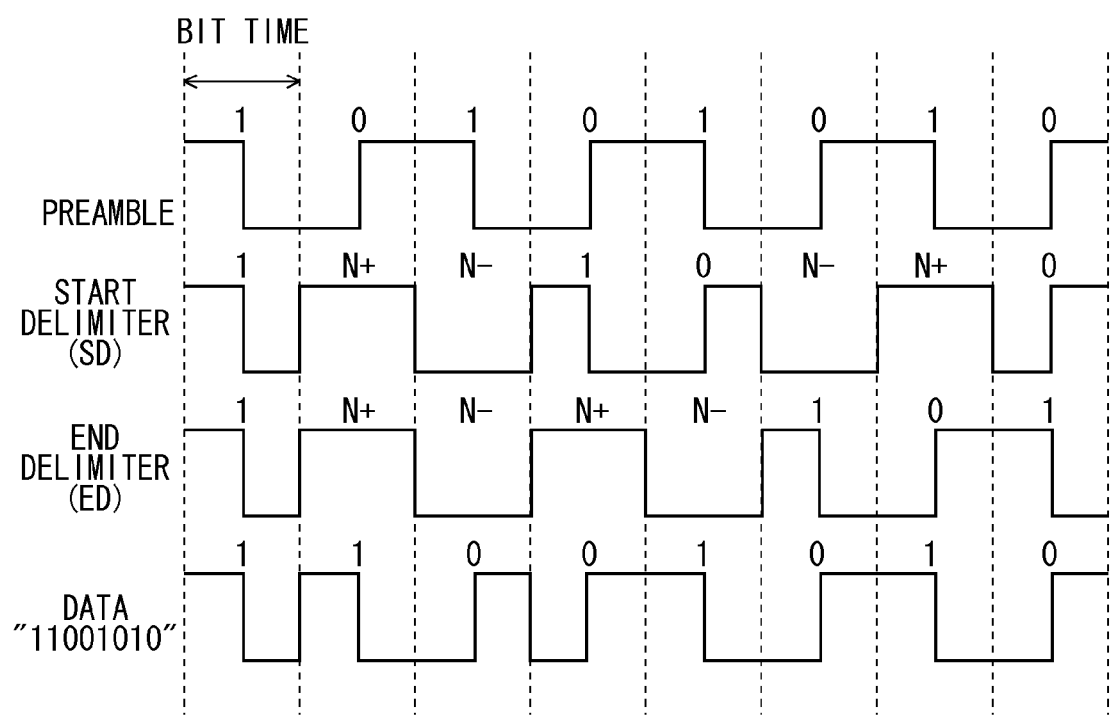
FIG. 9 is a diagram showing code definitions and an example of data code.
Figure 10:
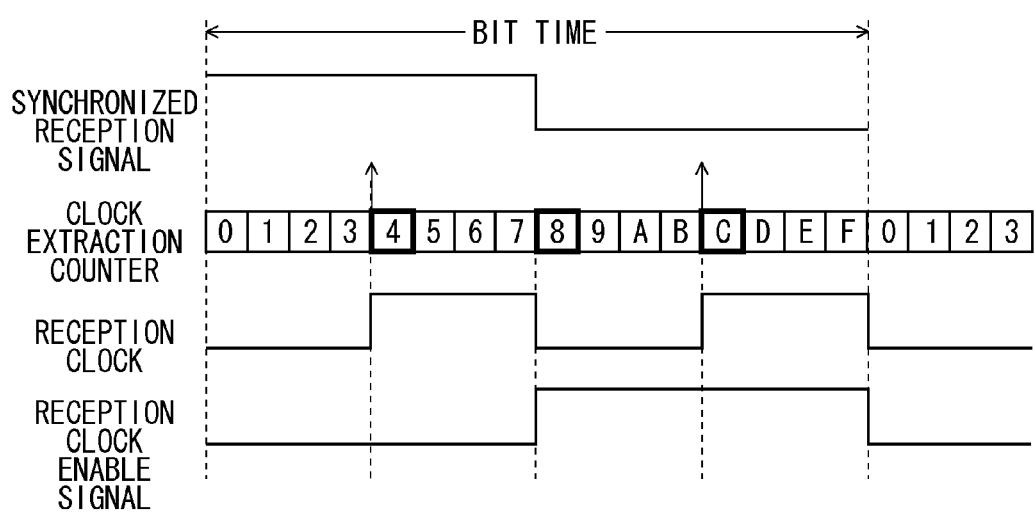
FIG. 10 is a diagram explaining timing of inverting a reception clock signal and a reception clock enable signal.
Figure 11:
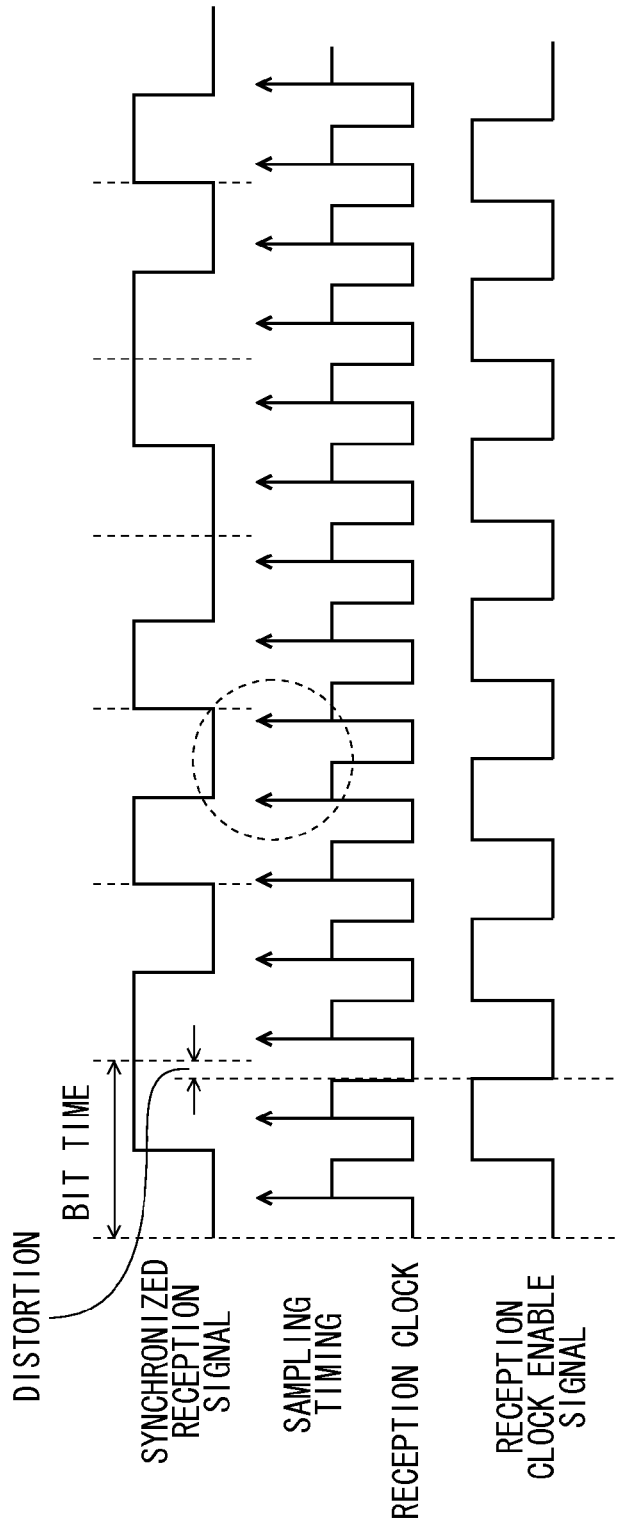
FIG. 11 is a diagram explaining bit time distortion.
Figure 12:
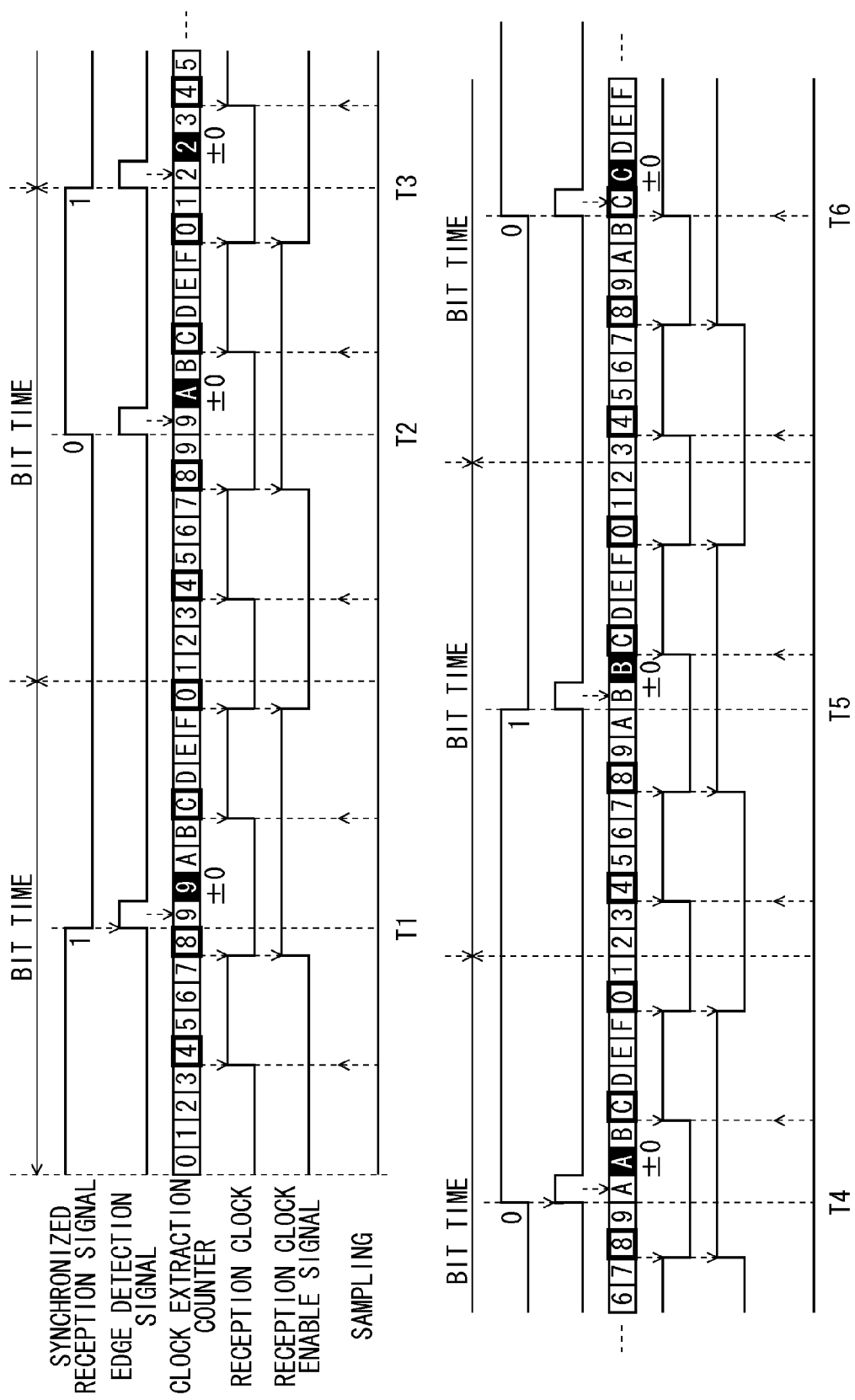
FIG. 12 is a timing chart illustrating an example of the operation in FIG. 7.
Figure 13:
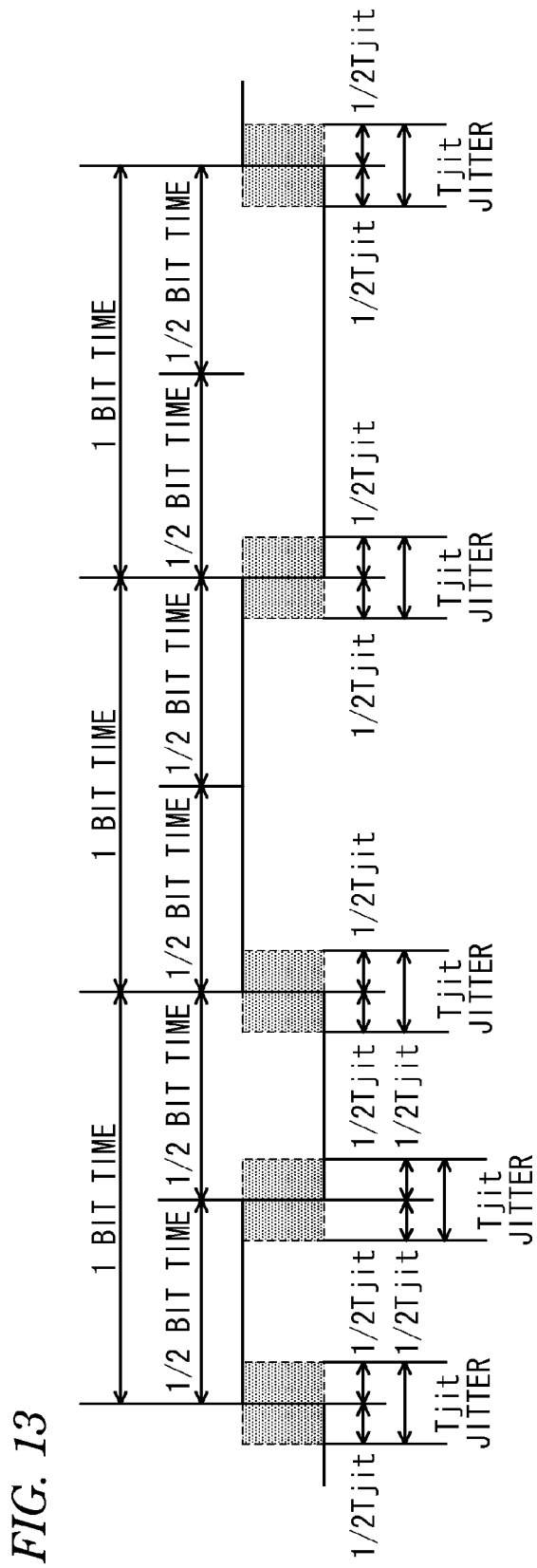
FIG. 13 is a diagram illustrating the definition of jitter in FIG. 7.
Figure 16:
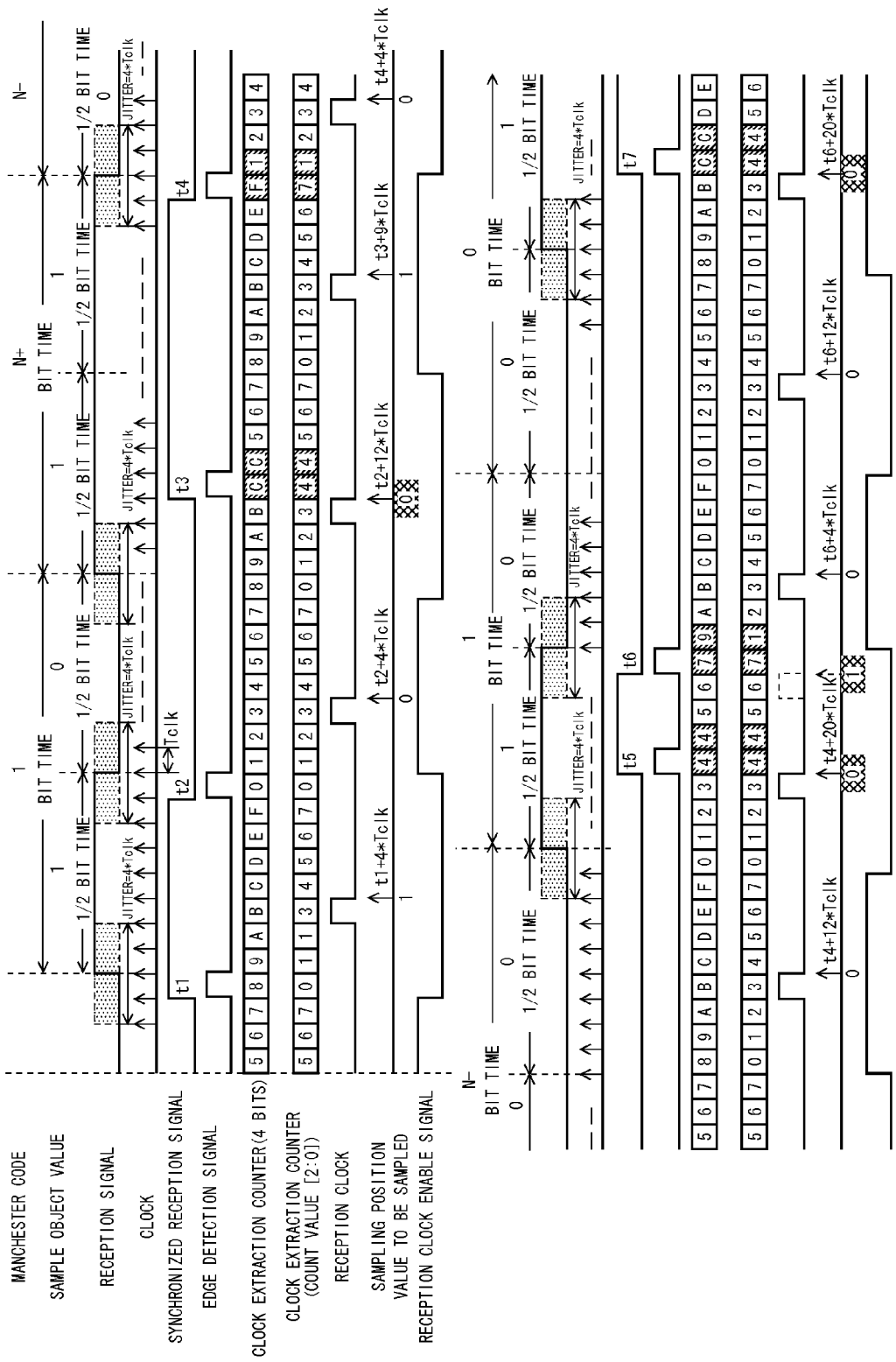
FIG. 16 is a timing chart illustrating a further example of the operation in FIG. 7.

Hereinafter, an embodiment of the invention will be described in detail with reference to the drawings. FIG. 1 is a block diagram showing the embodiment of the invention. In the figure, the components which are common to FIG. 7 are denoted by the same reference numerals. FIGS. 1 and 7 are different from each other in the configuration of the reception clock extracting module 230. In the reception clock extracting module 230 in FIG. 1, namely, an edge interval counter 233, an analog-circuit characteristic designating module 234, and a clock extraction controlling module 235 to which a function different from that in FIG. 7 is provided are disposed in addition to the clock extraction counter 232.

The edge interval counter 233 counts intervals of edges which is detected and output by the edge detecting module 220, and supplies the count data to the clock extraction controlling module 235.

Based on analog characteristics of the MAU 210 which are designated and input from the outside, the analog-circuit characteristic designating module 234 supplies a control signal for extracting clocks corresponding to the designated analog characteristics, to the clock extraction controlling module 235.

Specifically, the analog characteristics of the MAU 210 are at least one of: the rise delay characteristics in which the rising time of the reception signal is longer than the falling time; and the fall delay characteristics in which the falling time of the reception signal is longer than the rising time.

The clock extraction controlling module 235 includes a characteristic-based control element storing module 236 which controls a predetermined clock extracting operation so as to be performed based on the analog characteristics of the MAU 210 that are designated through the analog-circuit characteristic designating module 234.

The clock extraction counter 232 executes a predetermined counting operation based on a count value control signal which is output from the clock extraction controlling module 235.

In the thus configured invention, important points are the following two features:

a) a method of adjusting the count value of the clock extraction counter 232; and b) a control for suppressing the output of the reception clock signal.

These are correlated with each other, and a) is necessary for realizing b).

First, a) will be described.

A related-art method of adjusting a count value is an adjusting method in which, when the edge position leads an ideal position, as shown in FIG. 15, the count up operation is increased from the normal value of +1 by 1 to be set as +2, and, when the edge position lags, the count up operation is decreased from the normal value of +1 by 1 to be set as ±0. Therefore, the distance from the edge detection position to the sampling position (reception clock position) is not constant.

In the invention, by contrast, the count value of the clock extraction counter 232 is adjusted while changing the follow-up width to the edge position according to the deviation width of the edge position, and therefore the lower (N−1) bits of the count value subsequent to the edge detection position is always 1. As a result, the distance from the edge detection position to the sampling position is always constant (see FIG. 4). The specific count value adjusting method for realizing this is as indicated in the tables of FIGS. 2 and 3.

Next, b) will be described.

In order to correctly acquire a Manchester code, a signal of 1 bit time of communication data must be sampled once at ½ bit time, and twice at 1 bit time. In the invention, in order to enable a Manchester code to be correctly sampled even when an analog circuit which outputs the Manchester code has the characteristics a) or b) described above, when certain conditions hold, the output of the reception clock signal is suppressed, and sampling is skipped with respect to a sampling position which is at a constant distance from the edge detection position.

The certain conditions indicate the following two conditions for inhibiting sampling in order to correctly acquire a Manchester code:

<Condition 1> the case where sampling is the third one at 1 bit time of communication data; and <Condition 2> the case where sampling is the second one at ½ bit time of communication data.

When the above-described reception clock output control is performed, also a Manchester code having the analog circuit characteristics of a) or b) described above can be sampled once at ½ bit time, and twice at 1 bit time, and the Manchester code can be correctly acquired.

Specific reception clock output suppressing conditions for realizing this are (a-1), (a-2) and (b-1), (b-2) which will be described later.

(1) The reception signal which is transmitted through the transmission path 100 is converted to a Manchester code by the MAU 210, and then supplied to the edge detecting module 220.

(2) The edge detecting module 220 synchronizes the Manchester coded reception signal with a clock signal (CLK) in which the rate is $2^N$ times (N=3, 4, 5, . . . ) the communication rate, detects rising and falling edges, and supplies the edge detection signal to the reception clock extracting module 230.

(3) In the reception clock extracting module 230, the clock extraction controlling module 235 compares the count value of the clock extraction counter 232 at the timing when the edge detection signal becomes active (High), with the count value (when the bit width of the clock extraction counter 232 is N=4, for example, 0 or 8) of an ideal edge position where there is no jitter.

(4) In accordance with a result of the comparison of (3), moreover, the clock extraction controlling module 235 produces and outputs the count value control signal for adjusting the count value so as to operate following with the edge position which is detected by the count up operation of the clock extraction counter 232.

In the related-art method, the count value is adjusted in the following manner. When the detected edge position leads an ideal position where there is no jitter, the count up operation is further advanced (+2) from the normal value (+1) by 1, and, when the edge position lags, the count up operation is further delayed (±0) from the normal value (+1) by 1, In the related-art adjustment, as seen from FIG. 15, the distance from the edge position (the position of the edge detection signal) to the sampling position (the position of the reception clock position) is not constant, and hence the sampling position of the synchronized reception signal cannot be identified.

In the invention, by contrast, the follow-up width which follows the edge position of the synchronized reception signal is changed according to the deviation width of the edge position. Specifically, the count value is adjusted in accordance with a table such as shown in FIG. 2. In the case where the bit width of the clock extraction counter 232 is N=4, for example, the count value is adjusted in accordance with a table such as shown in FIG. 3.

In the count value adjustment in the invention, the lower (N−1) bits of the count value of the clock extraction counter 232 which is subsequent to the edge detection position where the edge detection signal becomes active (High) is always 1. Therefore, the time from the edge position (the position of the edge detection signal) to the sampling position (the position of the reception clock position) is always constant (the points of 4*Tclk, 12*Tclk, 20*Tclk, . . . from the edge position), and hence the sampling position of the synchronized reception signal can be identified.

(5) The clock extraction counter 232 outputs the reception clock signal at a cycle in which "the value of the lower (N−1) bits of the clock extraction counter 232 at the current clock (CLK) cycle is $2^{N-2}-1$" and "the value of the lower (N−1) bits of the clock extraction counter 232 at the next clock is $2^{N-2}$". The reception clock signal has a frequency which is two times the communication rate.

(6) The clock extraction counter 232 supplies the most significant bit of the clock extraction counter 232, as the reception clock enable signal to the reception controlling module 250.

(7) The code detecting module 240 samples the synchronized reception signal at the rising of the clock (CLK) during the High period of the reception clock signal, and performs decoding to recognize the type of the communication data.

Figure 4:
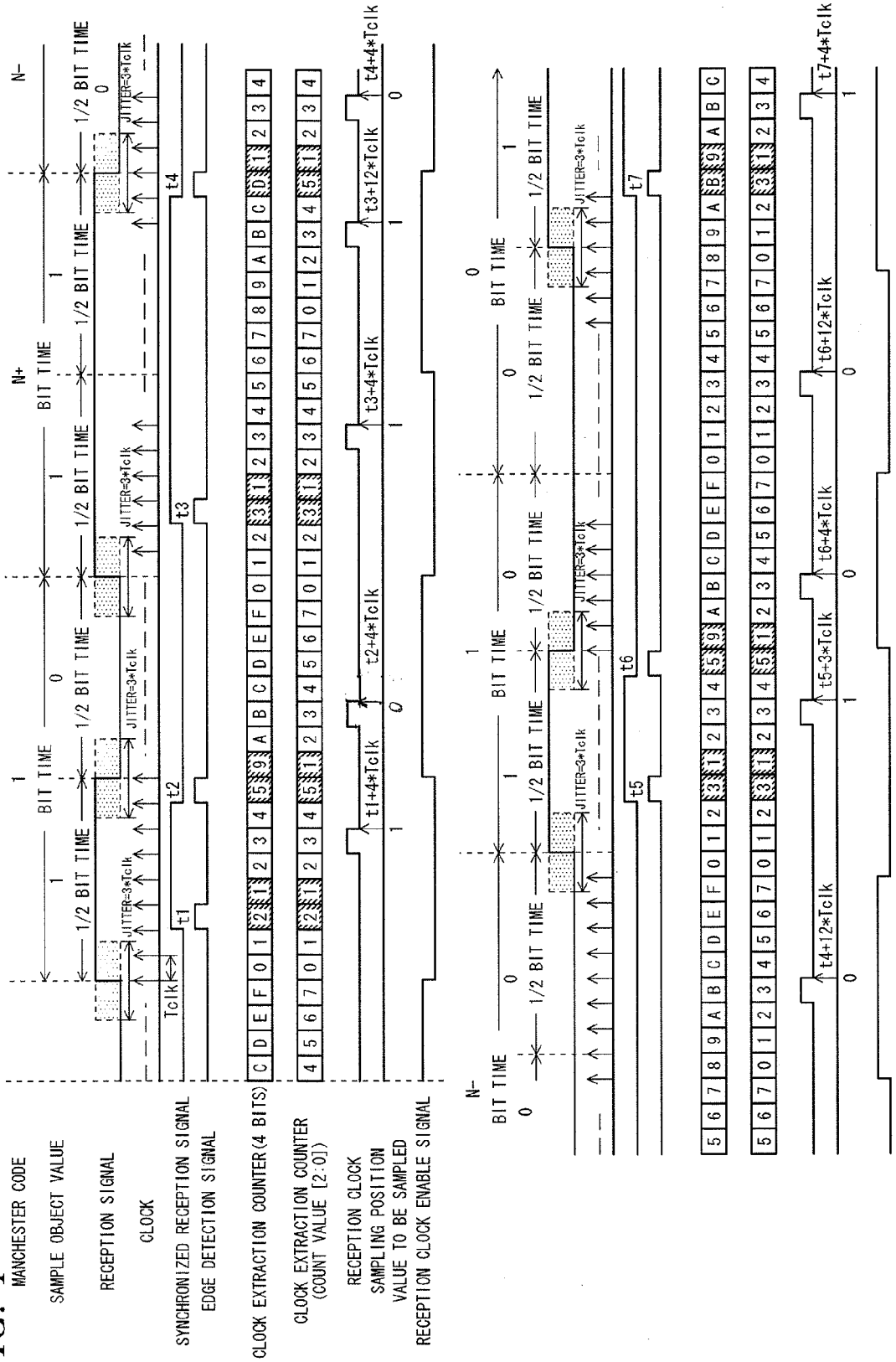
FIG. 4 is a timing chart illustrating an example of the operation in FIG. 1.

(8) The adjustment of the count value according to the table of FIG. 2 is a basic adjustment. When only the basic adjustment is performed, the reception jitter tolerance (limitation of jitter) becomes $(2^{N-2}-1)$*Tclk. FIG. 4 is a timing chart illustrating an example of the operation in the case where the bit width of the clock extraction counter 232 is N=4, and jitter is 3*Tclk.

Referring to FIG. 4, at respective timings t1 to t7 when the edge detection signal is output as a result of detection of an edge of the synchronized reception signal by the edge detecting module 220, the count value of the clock extraction counter 232 is adjusted as indicated by hatching the count value.

Figure 17A:
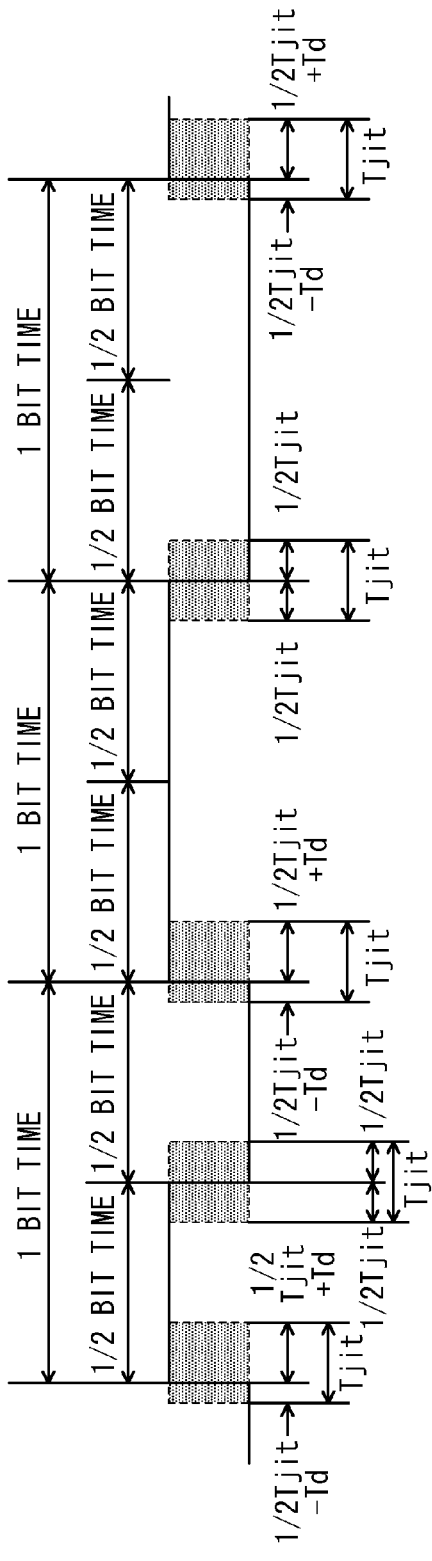
FIGS. 17A and 17B are diagrams showing waveform examples of a Manchester code.
Figure 17B:
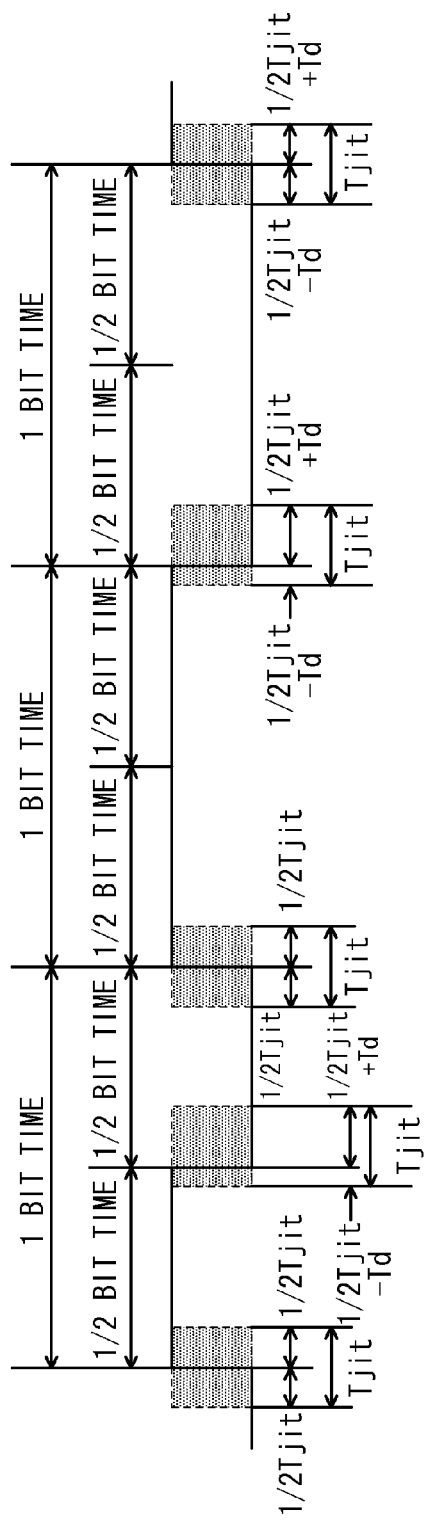

However, the analog circuit which outputs the Manchester code has the above-described characteristics a) or b). When there is a difference Td (within 1*Tclk) between the rising and falling characteristics as shown in FIG. 17 described above, therefore, the pulse width of the Manchester code which is input to a digital circuit becomes as described below, and the reception jitter tolerance cannot satisfy $(2^{N-2}-1)$*Tclk.

In the case of characteristics a)
1) The maximum value of the High pulse width of the synchronized reception signal is 1 bit time $(=2^{N}*Tclk)+(2^{N-2}-1)$*Tclk, and that of the Low pulse width is 1 bit time+$2^{N-2}$*Tclk (when 1 bit time=32 µs, N=4, and Tclk=2 µs, for example, the maximum values are 38 µs and 40 µs, respectively).

2) The minimum value of the High pulse width of the synchronized reception signal is ½ bit time $(=2^{N-1}*Tclk)-2^{N-2}$*Tclk, and that of the Low pulse width is ½ bit time−$(2^{N-2}-1)$*Tclk (when 1 bit time=32 µs, N=4, and Tclk=2 µs, for example, the minimum values are 8 µs and 10 µs, respectively).

3) In the case where the High pulse width of ideal 1 bit time of the synchronized reception signal is shortened by jitter, the minimum value of the High pulse width is 1 bit time−$2^{N-2}$*Tclk, and, in the case where the Low pulse width of ideal 1 bit time is shortened by jitter, the minimum value of the Low pulse width is 1 bit time−$(2^{N-2}-1)$*Tclk (when 1 bit time=32 µs, N=4, and Tclk=2 µs, for example, the minimum values are 24 µs and 26 µs, respectively).

4) In the case where the High pulse width of ideal ½ bit time of the synchronized reception signal is lengthened by jitter, the maximum value of the High pulse width is ½ bit time+$(2^{N-2}-1)$*Tclk, and, in the case where the Low pulse width of ideal ½ bit time is lengthened by jitter, the maximum value of the Low pulse width is ½ bit time+$2^{N-2}$*Tclk (when 1 bit time=32 µs, N=4, and Tclk=2 µs, for example, the maximum values are 22 µs and 24 µs, respectively).

In the case of characteristics b)
1) The maximum value of the High pulse width of the synchronized reception signal is 1 bit time $(=2^{N}*Tclk)+2^{N-2}$*Tclk, and that of the Low pulse width is 1 bit time+$(2^{N-2}-1)$*Tclk (when 1 bit time=32 µs, N=4, and Tclk=2 µs, for example, the maximum values are 40 µs and 38 µs, respectively).

2) The minimum value of the High pulse width of the synchronized reception signal is ½ bit time $(=2^{N-1}*Tclk)-(2^{N-2}-1)$*Tclk, and that of the Low pulse width is ½ bit time−$2^{N-2}$*Tclk (when 1 bit time=32 µs, N=4, and Tclk=2 µs, for example, the minimum values are 10 µs and 8 µs, respectively).

3) In the case where the High pulse width of ideal 1 bit time of the synchronized reception signal is shortened by jitter, the minimum value of the High pulse width is 1 bit time−$(2^{N-2}-1)$*Tclk, and, in the case where the Low pulse width of ideal 1 bit time is shortened by jitter, the minimum value of the Low pulse width is 1 bit time−$2^{N-2}$*Tclk (when 1 bit time=32 µs, N=4, and Tclk=2 µs, for example, the minimum values are 26 µs and 24 µs, respectively).

4) In the case where the High pulse width of ideal ½ bit time of the synchronized reception signal is lengthened by jitter, the maximum value of the High pulse width is ½ bit time+$2^{N-2}$*Tclk, and, in the case where the Low pulse width of ideal ½ bit time in which there is no jitter is lengthened by jitter, the maximum value of the Low pulse width is ½ bit time+$(2^{N-2}-1)$*Tclk (when 1 bit time=32 µs, N=4, and Tclk=2 µs, for example, the maximum values are 24 µs and 22 µs, respectively).

(9) In the invention, even when the analog circuit has the characteristics a) or b), a Manchester code which is input to a digital circuit can be correctly sampled. Specifically, the count value of the edge interval counter 233 is supplied to the clock extraction controlling module 235, and conditions for the reception clock output are added. The edge interval counter 233 is a counter in which, at the timing when the edge detection signal becomes active (High), the count value is initialized to 0, and, at the other timings, the count value is simply incremented (+1). The conditions to be added are as described below.

In the case of characteristics a)

The fact that the analog circuit has the characteristics a) is designated from the outside into the characteristic-based control element storing module 236 through the analog-circuit characteristic designating module 234. Then, a characteristic-based control element which performs a control so as to execute a clock extracting operation corresponding to the characteristics a) is read from the characteristic-based control element storing module 236 into the clock extraction controlling module 235.

(a-1) In the case where, when the Low pulse width of the synchronized reception signal is the maximum value of $(2^N+2^{N-2})*Tclk$, the value of the edge interval counter 233 becomes $2^N+2^{N-2}-2$, the reception clock signal is not output even when the conditions indicated in (5) above hold. As a result, the synchronized reception signal at this timing is not sampled in the code detecting module 240.

Figure 5:
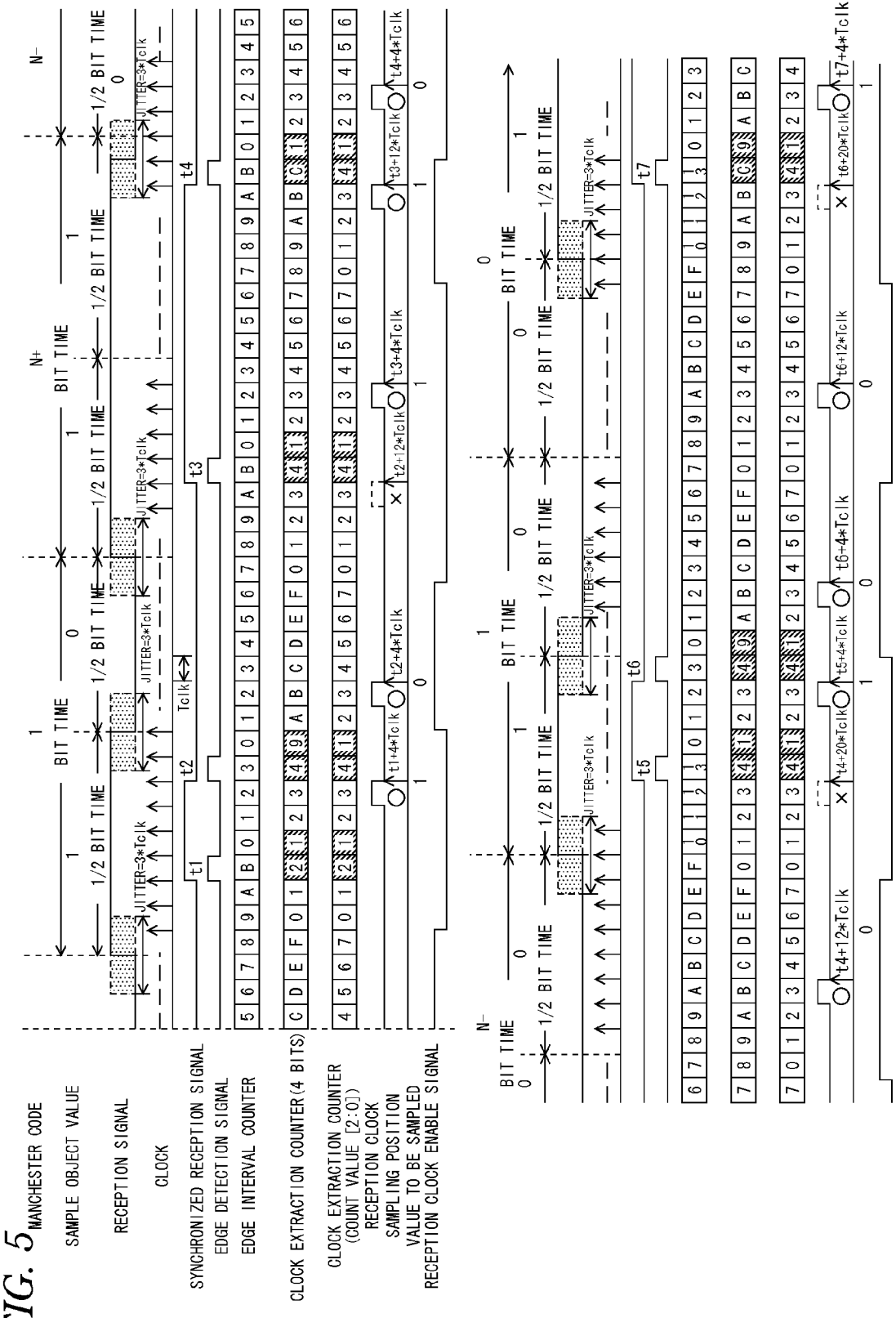
FIG. 5 is a timing chart illustrating another example of the operation in FIG. 1.

The timings of t4+20*Tclk and t6+20*Tclk in the timing chart of FIG. 5 correspond to the conditions (a-1). The state where the conditions hold corresponds to the third sampling point in 1 bit time of the communication data, and the reception clock signal is not necessary for acquiring the correct value.

(a-2) When the following conditions are established by a state where the Low pulse width of ideal ½ bit time of the synchronized reception signal is lengthened by jitter to become the maximum value of $(2^{N-1}+2^{N-2})*Tclk$, the reception clock signal is not output even when the conditions indicated in (5) above hold. As a result, the synchronized reception signal at this timing is not sampled in the code detecting module 240.

The timing of t2+12*Tclk in the timing chart of FIG. 5 corresponds to the conditions (a-2).

<Conditions>

"The value of the edge interval counter 233 is $2^{N-1}+2^{N-2}-2$" "the edge detection signal is active (High) in the next cycle", and "the synchronized reception signal is Low".

The state where the conditions hold corresponds to the second sampling point in ½ bit time of the communication data, and the reception clock signal is not necessary for acquiring the correct value.

In a state other than that where the conditions of (a-1) and (a-2) hold, the reception clock signal is output in accordance with the condition of (5).

In the case of characteristics b)

The fact that the analog circuit has the characteristics b) is designated from the outside into the characteristic-based control element storing module 236 through the analog-circuit characteristic designating module 234. Then, a characteristic-based control element which performs a control so as to execute a clock extracting operation corresponding to the characteristics b) is read from the characteristic-based control element storing module 236 into the clock extraction controlling module 235.

(b-1) In the case where, when the High pulse width of the synchronized reception signal is the maximum value of $(2^N+2^{N-2})*Tclk$, the value of the edge interval counter becomes $2^N+2^{N-2}-2$, the reception clock signal is not output even when the conditions indicated in (5) above hold. As a result, the synchronized reception signal at this timing is not sampled in the code detecting module 240.

Figure 6:
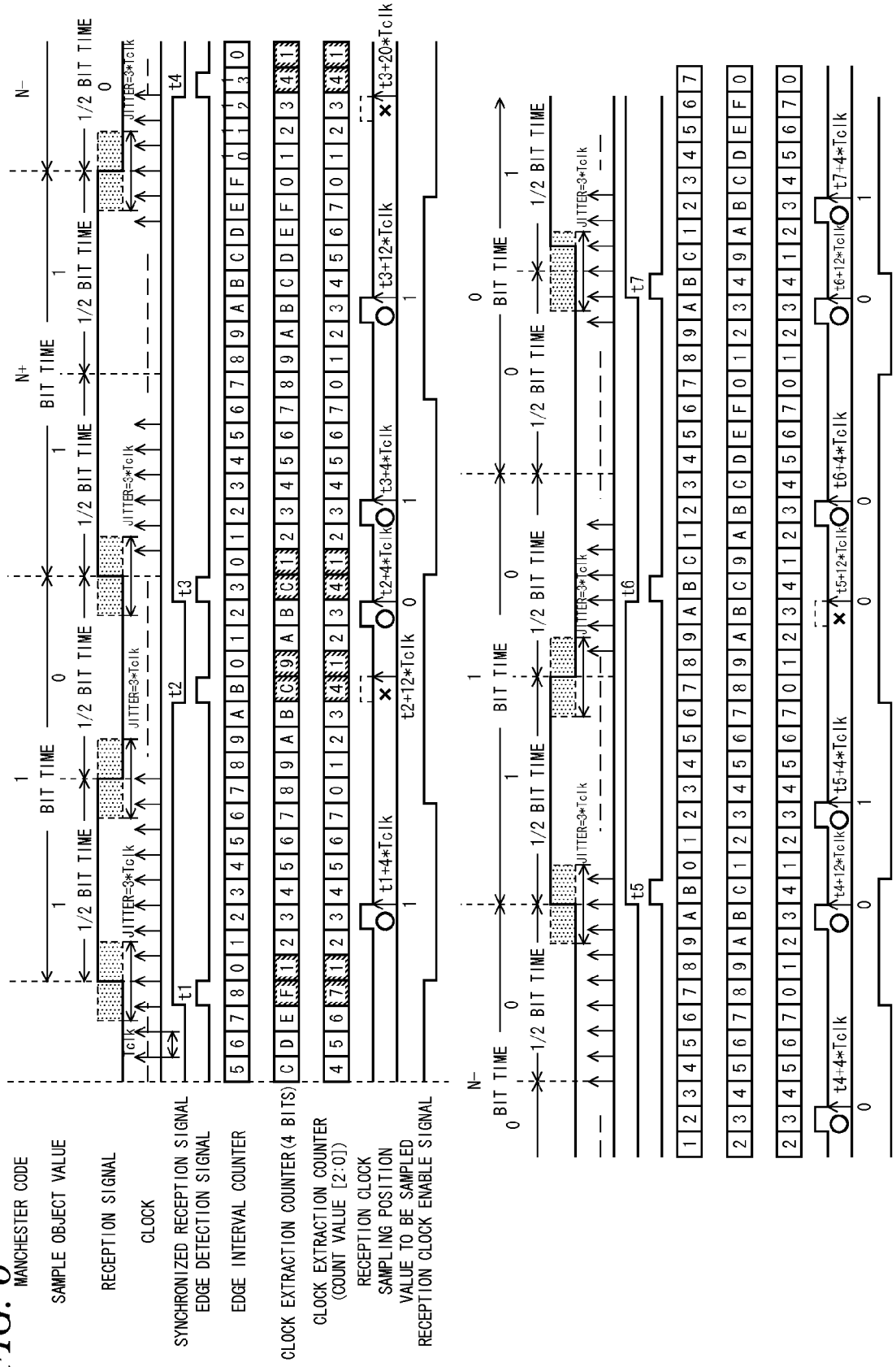
FIG. 6 is a timing chart illustrating a further example of the operation in FIG. 1.

The timing of t3+20*Tclk in the timing chart of FIG. 6 corresponds to the conditions (b-1). The state where the conditions hold corresponds to the third sampling point in 1 bit time of the communication data, and the reception clock signal is not necessary for acquiring the correct value.

(b-2) When the following conditions are established by a state where the High pulse width of ideal ½ bit time of the synchronized reception signal is lengthened by jitter to become the maximum value of $(2^{N-1}+2^{N-2})*Tclk$, the reception clock signal is not output even when the conditions indicated in (5) above hold. As a result, the synchronized reception signal at this timing is not sampled in the code detecting module 240.

The timings of t1+12*Tclk and t5+12*Tclk in the timing chart of FIG. 6 correspond to the conditions (b-2).

<Conditions>

"The value of the edge interval counter is $2^{N-1}+2^{N-2}-2$", "the edge detection signal is active (High) in the next cycle", and "the synchronized reception signal is High".

The state where the conditions hold corresponds to the second sampling point in ½ bit time of the communication data, and the reception clock signal is not necessary for acquiring the correct value.

In a state other than that where the conditions of (b-1) and (b-2) hold, the reception clock signal is output in accordance with the condition of (5).

When the above-described reception clock output control is performed, also a reception signal of jitter of $(2^{N-2}-1)*Tclk$ having the analog circuit characteristics of a) or b) can be sampled twice per 1 bit time (once per ½ bit time), and the reception signal can be correctly sampled.

(10) Received data of the code type, "1", and "0" are output to the reception controlling module 250 which is in the subsequent stage, and which performs a reception control.

(11) According to the operation of the invention, when the time difference between the rising and the falling is within 1*Tclk, a jitter increase in a Manchester code which is caused by the characteristics of a) or b) of the analog circuit is corrected on the side of the digital circuit, and the total reception jitter tolerance of the analog circuit and the digital circuit is improved, whereby the reception jitter tolerance can be maintained to $(2^{N-2}-1)*Tclk$.

The timing chart of FIG. 5 shows a case where, when the bit width of the clock extraction counter 232 is N=4, the analog circuit has the characteristics of a), jitter of 3*Tclk at the rising of the synchronized reception signal is therefore delayed by ½*Tclk, but the circuit of FIG. 1 which is configured based on the invention follows the delay and correctly samples the synchronized reception signal. The timing chart of FIG. 6 shows a similar case where the analog circuit has the characteristics of b).

According to the invention, as described above, it is possible to realize a Manchester code receiving circuit which can compensate a jitter increase in a Manchester code caused by a difference between the rising time and the falling time, and which has an excellent reception jitter tolerance.

What is claimed is:

1. A Manchester code receiving circuit comprising:
an analog circuit configured to convert an analog signal received through a communication transmission path, to a digital signal based on a Manchester code; and
a characteristic compensating unit configured to compensate at least one of rise delay characteristics in which a rising time of the digital signal is longer than a falling time, and fall delay characteristics in which the falling time of the digital signal is longer than the rising time, wherein the characteristic compensating unit includes a characteristic-based control element storing module configured to store a characteristic-based control element, and is configured to execute a clock extracting operation based on the characteristic-based control element which is read out from the characteristic-based control element storing module.

* * * * *